United States Patent
Coomer et al.

(10) Patent No.: US 6,692,219 B2
(45) Date of Patent: Feb. 17, 2004

(54) REDUCED EDGE CONTACT WAFER HANDLING SYSTEM AND METHOD OF RETROFITTING AND USING SAME

(75) Inventors: Stephen D. Coomer, Tempe, AZ (US); Stanislaw Kopacz, Phoenix, AZ (US); Glyn Reynolds, Gilbert, AZ (US); Michael James Lombardi, Phoenix, AZ (US); Todd Michael Visconti, Phoenix, AZ (US)

(73) Assignee: Tokyo Electron Limited, Tokyo (JP)

( * ) Notice: Subject to any disclaimer, the term of this patent is extended or adjusted under 35 U.S.C. 154(b) by 192 days.

(21) Appl. No.: 09/725,823

(22) Filed: Nov. 29, 2000

(65) Prior Publication Data

US 2002/0064450 A1 May 30, 2002

(51) Int. Cl.$^7$ ................................ B25J 15/06
(52) U.S. Cl. .................. 414/754; 414/416; 414/935; 414/939; 414/940; 294/64.1
(58) Field of Search .................. 414/416, 939, 414/935, 940, 941, 754, 755; 294/64.1

(56) References Cited

U.S. PATENT DOCUMENTS

| | | | |
|---|---|---|---|
| 4,915,564 A | | 4/1990 | Eror et al. |
| 5,516,732 A | | 5/1996 | Flegal |
| 5,647,626 A | * | 7/1997 | Chen et al. ................. 294/87.1 |
| 5,700,046 A | * | 12/1997 | Van Doren et al. ...... 294/119.1 |
| 5,711,646 A | * | 1/1998 | Ueda et al. ................. 414/225 |
| 5,746,460 A | * | 5/1998 | Marohl et al. ................ 294/1.1 |
| 5,749,469 A | * | 5/1998 | Williams .................... 206/710 |
| 5,765,889 A | * | 6/1998 | Nam et al. .................. 294/64.1 |
| 5,820,329 A | | 10/1998 | Derbinski et al. |
| 5,980,194 A | * | 11/1999 | Freerks et al. ............. 414/754 |
| 6,116,848 A | * | 9/2000 | Thomas et al. ............. 414/754 |
| 6,143,147 A | | 11/2000 | Jelinek |
| 6,298,280 B1 | * | 10/2001 | Bonora et al. .............. 700/218 |
| 6,357,996 B2 | * | 3/2002 | Bacchi et al. ................ 414/754 |
| 6,409,453 B1 | * | 6/2002 | Brodine et al. ............. 414/416 |

FOREIGN PATENT DOCUMENTS

| | | |
|---|---|---|
| JP | 2000260859 | 9/2000 |
| WO | WO 9923691 | 5/1999 |
| WO | WO 0002808 | 1/2000 |
| WO | WO 0014772 | 3/2000 |

* cited by examiner

Primary Examiner—Joseph A. Fischetti
(74) Attorney, Agent, or Firm—Wood, Herron & Evans, L.L.P.

(57) ABSTRACT

A wafer handling system and a method of retrofitting the system to an existing wafer handling apparatus are provided that make possible a method of handling wafers by contacting only a narrow area of not more than two millimeters wide adjacent the edge of the wafer, which is particularly useful for backside deposition where device side contact defines an area of exclusion that renders the wafer unusable in that area. The system provides a chuck on a wafer transfer arm that holds a wafer by gravity on a segmented, upwardly facing annular surface. A compatible annular surface is provided on an aligning station chuck so that wafers can be transferred by contact only with the exclusion area of the wafer surface. A load arm has two similarly compatible chucks further provided with pneumatically actuated grippers to allow the wafer to be loaded into a vertical processing apparatus. The wafer chucks are retrofitted into a processing apparatus in place of vacuum chucks and the vacuum lines that were provided to activate them are used for wafer detection. The electrical signals that were provided for vacuum chuck commands are utilized to actuate the grippers on the transfer arm so that no control software and little hardware need be altered for the retrofit.

12 Claims, 9 Drawing Sheets

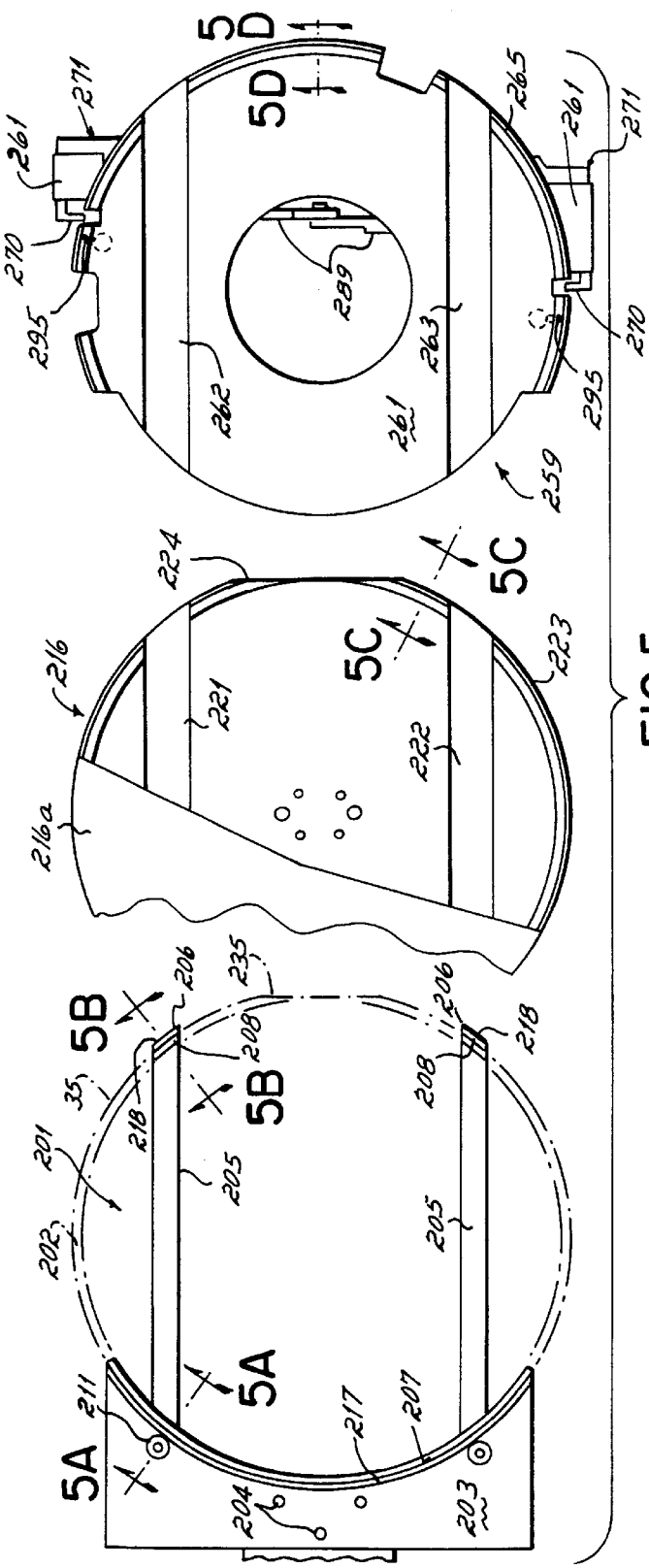

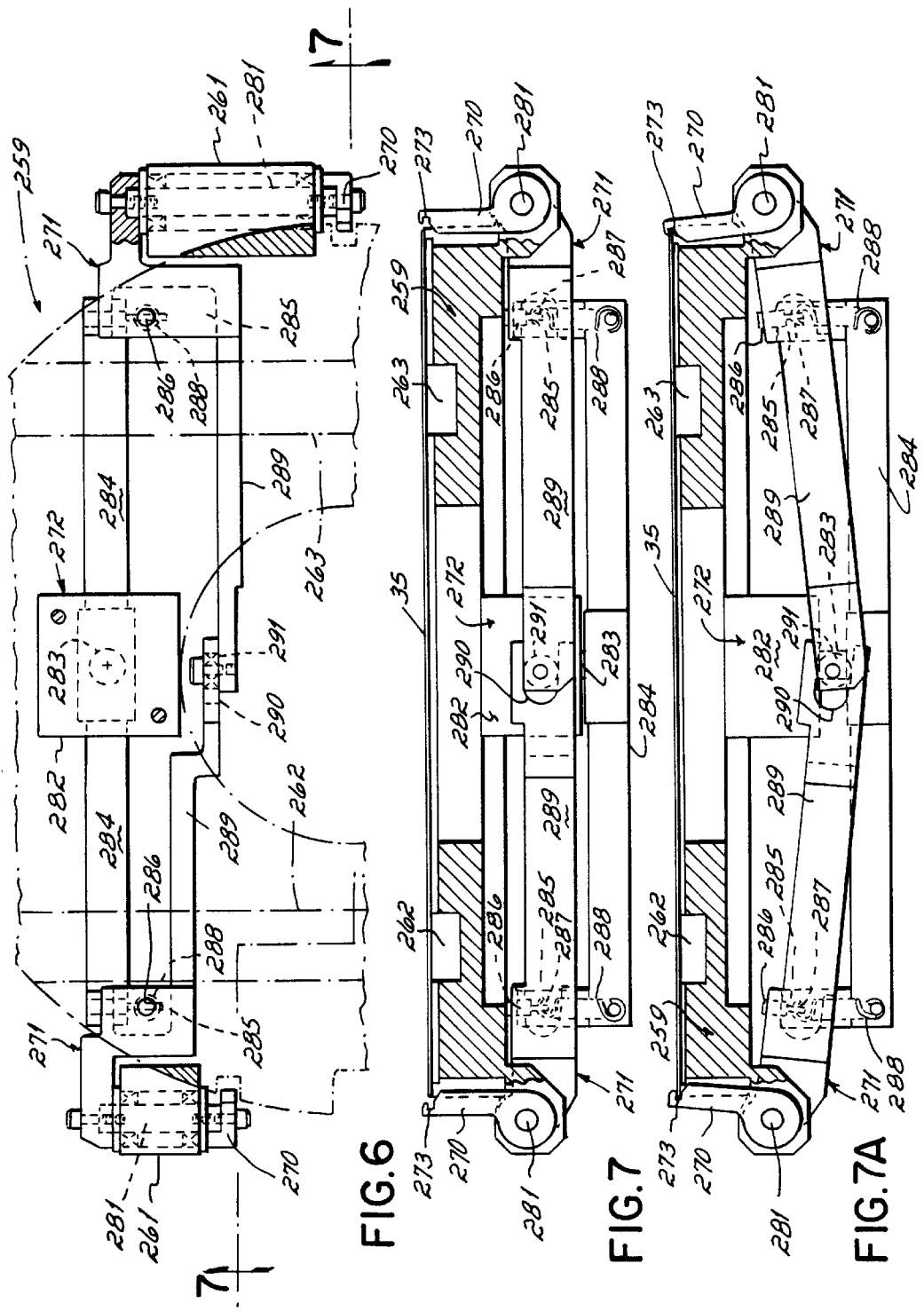

REDUCED EDGE CONTACT WAFER HANDLING SYSTEM AND METHOD OF RETROFITTING AND USING SAME

This invention relates to the wafer handling, and particularly to the transfer and holding, of semiconductor wafer substrates during semiconductor manufacture, more particularly, wafers of diameters of 200 millimeters (mm) and larger.

BACKGROUND OF THE INVENTION

In the semiconductor industry, many companies manufacture equipment to process semiconductor wafers, particularly silicon wafers, for device production. Semiconductor wafer processing equipment employs automated and robotic wafer handlers for moving the wafers through the processing equipment and for holding the wafers for processing. Wafer handlers in the industry typically involve the use of a vacuum chuck that includes a vacuum-type spatula or end effector on a robotic arm, which makes contact with the backside of the wafer. With the more versatile handlers, contact with the wafer is made by the vacuum chuck in a circular area at the center of the wafer. One such wafer handling system is described in U.S. Pat. No. 5,820,329, hereby expressly incorporated by reference herein. Such wafer handling is typical in many wafer processing machines for the processing of the device sides of the wafers.

In semiconductor manufacture, when processing of the device side of a wafer is complete, a backside metallization layer is sometimes applied. For some devices, the metallization layer is often gold. Backside metallization with gold, and wafer holders for such processes, is described in the commonly assigned U.S. Pat. No. 6,258,228, filed Jan. 8, 1999, and hereby expressly incorporated by reference herein. For backside metallization, similar processing equipment is used as is used to process the device sides of wafers, but the wafer orientation is reversed. Reversal of the orientation of a partially processed wafer would expose the devices at the center of the wafer to contact by the vacuum chuck of the wafer transfer arm. The devices usually cannot be subjected to such contact without suffering damage.

For this reason, vacuum chucks have been developed to grip the wafer along a 6 mm ring inside of the edge of the wafer. As a result, a 6 mm ring at the edge of the wafer is reserved as an exclusion zone in which the wafer cannot be used for device manufacture. The 6 mm ring of exclusion is needed to provide a surface area that is enough to enable a vacuum chuck to reliably hold the wafer in the vertical, horizontal and inverted orientations that are required of a handler. Typically, for a wafer of 200 mm in diameter, a 6 mm contact area on the wafer engaged by elements of the wafer handler along the edge of the wafer, amounts to an area of over 36 square centimeters or twelve percent of the area of the wafer. A need has been expressed in the industry for the contact areas between the wafers and the wafer handlers to be reduced, preferably to not more than two mm around the edge of a 200 mm or 300 mm wafer. A two mm exclusion zone contains an area of only about 12 square centimeters on a 200 mm wafer and 18 square centimeters on a 300 mm wafer. This need has not been filled in the prior art.

Wafer handlers operate and are controlled in conjunction with the operation and control of the machines of which they are a part or with which they interact. Fundamental changes in the nature and operation of wafer handlers, if made, may be incompatible with, and can adversely affect, the operation and control of the semiconductor processing machines. Unless wafer handler changes are accompanied by replacement or redesign of the machines (e.g. via a kit), impact on operating software and on system operation can occur.

These contact areas typically prevent use of the portion of the wafer bounded by the contacted area for device manufacture, limiting the per-wafer device yield. As pattern geometries become smaller and demands for higher per-wafer yield become greater, the need for increased useful area of the wafer becomes greater.

Accordingly, there is a need for a wafer handler and a wafer handling technique that provides for a smaller contact area or exclusion zone where contact with the wafer is allowed. There is also a need for such improved wafer handling in a way that does not impact upon the operating software and systems operation of the machines with which such an improved handler or handling technique is used.

SUMMARY OF THE INVENTION

A primary objective of the present invention is to provide for the engaging and transfer of a semiconductor wafer for backside processing while making minimal contact with the device side of the wafer. A particular objective of the invention is to provide for the engagement and transfer of a semiconductor wafer while contacting the wafer in a zone of exclusion adjacent the periphery of the wafer, and more particularly, where the zone of exclusion is not more than two mm wide.

A further objective of the present invention is to provide a method and apparatus for the holding and transfer of wafers that is capable of holding and transferring wafers of differing sizes, particularly of diameters of 200 mm and 300 mm, and that is capable among wafers of differing sizes.

Another objective of the invention is to provide a wafer holding and transferring system that provides for reduced device side contact for the backside processing of wafers that is compatible with, and can be retrofitted to, processing machines of the prior art that do not otherwise have such capability. A more particular objective of the invention is to provide for the retrofit of such a system to an existing processing machine with minimal impact on the hardware of the processing machine and with little or no impact on the operating software of the processing machine.

According to the principles of the present invention, a wafer handling system is provided having a wafer transfer arm chuck, a centering station chuck and a load arm chuck which can hold and exchange wafers between chucks, wafer cassettes and processing machine wafer holders while contacting a reduced area on the surface of the wafer, and which is capable of contacting only an exclusion zone of preferably not more than approximately two mm in width adjacent the periphery of the wafer on the device side of the wafer during backside processing.

In certain embodiments, the wafer chucks of the transfer arm and load arm have beveled edge rings or edge ring segments that are of a diameter larger than the diameter of the wafer. The beveled edge rings insure that only a narrow exclusion zone on the edge of the wafer comes into contact with surfaces on the chucks that support the wafer. For some applications, the centering station chuck may also be provided with such a beveled edge ring.

In certain embodiments, an end effector chuck is provided on the transfer arm. The end effector is of multiple piece construction to achieve greater flatness, uses an internal vacuum channel to determine wafer presence and has ceramic outriggers that are adjustable to accommodate wafers of differing diameter, for example, diameters of 200 mm and 300 mm.

The centering station chuck corrects wafer flat and crystal orientation of the wafer and wafer centering. The chuck is preferably of multiple piece construction and uses a vacuum channel to sense the presence of the wafer and optical sensors to sense the wafer flat orientation as the chuck rotates the wafer. The surface of the centering station chuck has recesses such as clearance grooves to allow the outriggers of the end effector to successfully place or remove a wafer within an acceptable window of the chuck orientation relative to a home position.

The load arm chuck is in some respects similar to the centering station chuck in the way that it interacts with the transfer arm chuck but does not rotate to alter the orientation of the wafer. It uses a vacuum channel to determine wafer presence. The load arm has pivotal wafer edge hooks or gripper elements that grip the edge of the wafer within the exclusion zone. The gripper elements are pneumatically operated by electro-pneumatic actuators that can be responsive to the same electrical control signals that operate the vacuum controls as were the vacuum chucks of previous load arms. The gripper elements of the load arm chucks are actuated in response to the motion of the robot transfer arm in relation to the load arm or the load arm in relation to the wafer holder of the processing machine. The gripper elements may be pivotal gripper hooks, or in lieu of the pivotal gripper hooks, may be other types of wafer holding devices such rotary latches, similar to those having pivotal rollers or non-contact tabs of the described prior art, which can be rotated over the edge of the wafer to latch the wafer to the load arm chuck. The gripper elements allow the load arm to hold the wafer in a vertical orientation or facing downwardly and while being held in or moved through some other or different orientations.

In certain embodiments of the invention, a vacuum chuck equipped system is retrofitted with mechanical wafer engaging chucks, particularly replacing the vacuum chucks on a transfer arm end effector, a wafer centering or aligning station and a wafer load arm. In such a system, the transfer arm may be operable to pick up and move horizontally disposed wafers, transferring them to and from wafer cassettes, the centering or aligning station and the load arm. Also, the chuck at the centering and aligning station may be operable to receive a wafer from the transfer arm, to orient and align the wafer and to return the wafer to a centered and oriented position on the transfer arm, also in a horizontal orientation. Additionally, the load arm chucks may be operable to move a wafer between the transfer arm chuck and a wafer holder of the wafer processing machine, or exchange one wafer with another, reorienting the wafers between a horizontal orientation on the transfer arm and a vertical orientation in the wafer holder of the processing machine. Wafers are held at least in part by gravity on the horizontally disposed, upwardly facing chucks of the transfer arm and aligning station and are held in part by gravity on the load arm chucks when they are horizontally disposed and upwardly facing during transfer of the wafers to and from the transfer arm, and by positive wafer edge gripper hooks, when being moved in other orientations.

In certain embodiments of the invention, the controls of the wafer handling system are compatible with the controls of the vacuum chuck equipped, prior art machine so that the system can be retrofitted thereto without substantial hardware changes and without modification to the control software of the machine. Vacuum chuck control lines are used to sense the presence of wafers on the chucks. Gripper operating pneumatic cylinders are operated by electro-pneumatic solenoids that are controlled by electrical software vacuum command signals that were provided for vacuum chuck operation.

Embodiments of the present invention may be provided in the form of a retrofit kit that includes the three chuck assemblies configured to replace vacuum chucks of the transfer arm, aligning station and load arm of existing processing machines.

The method and apparatus of the present invention provides the advantage of increasing the useful area of a wafer by approximately four percent, or from 88% to 96% of the area of the wafer, reducing by two-thirds the exclusion zone or unusable area of the wafer, and providing, on average, similar increases in the number of devices produced per wafer, thereby improving the productivity of the semiconductor making processes and machinery.

These and other objectives and advantages of the present invention will be more readily apparent from the following detailed description.

BRIEF DESCRIPTION OF THE DRAWINGS

FIG. 5 is a schematic top view of the end effector of the wafer transfer arm of the wafer handling system of FIG. 4 aligned with the wafer chucks of the aligning station and the load arm.

FIG. 5A is a sectional view along line 5A—5A of FIG. 5.

FIG. 5B is a sectional view along line 5B—5B of FIG. 5.

FIG. 5C is a sectional view along line 5C—5C of FIG. 5.

FIG. 5D is a sectional view along line 5D—5D of FIG. 5.

FIG. 6 is a partial top view of the gripper mechanism of the load arm chuck of FIG. 5.

FIG. 7 is a cross-sectional view along line 7—7 of FIG. 6 illustrating the load arm chuck grippers in a release position.

FIG. 7A is a cross-sectional view similar to FIG. 7 illustrating the load arm chuck grippers gripping a wafer.

DETAILED DESCRIPTION

Figure 1:
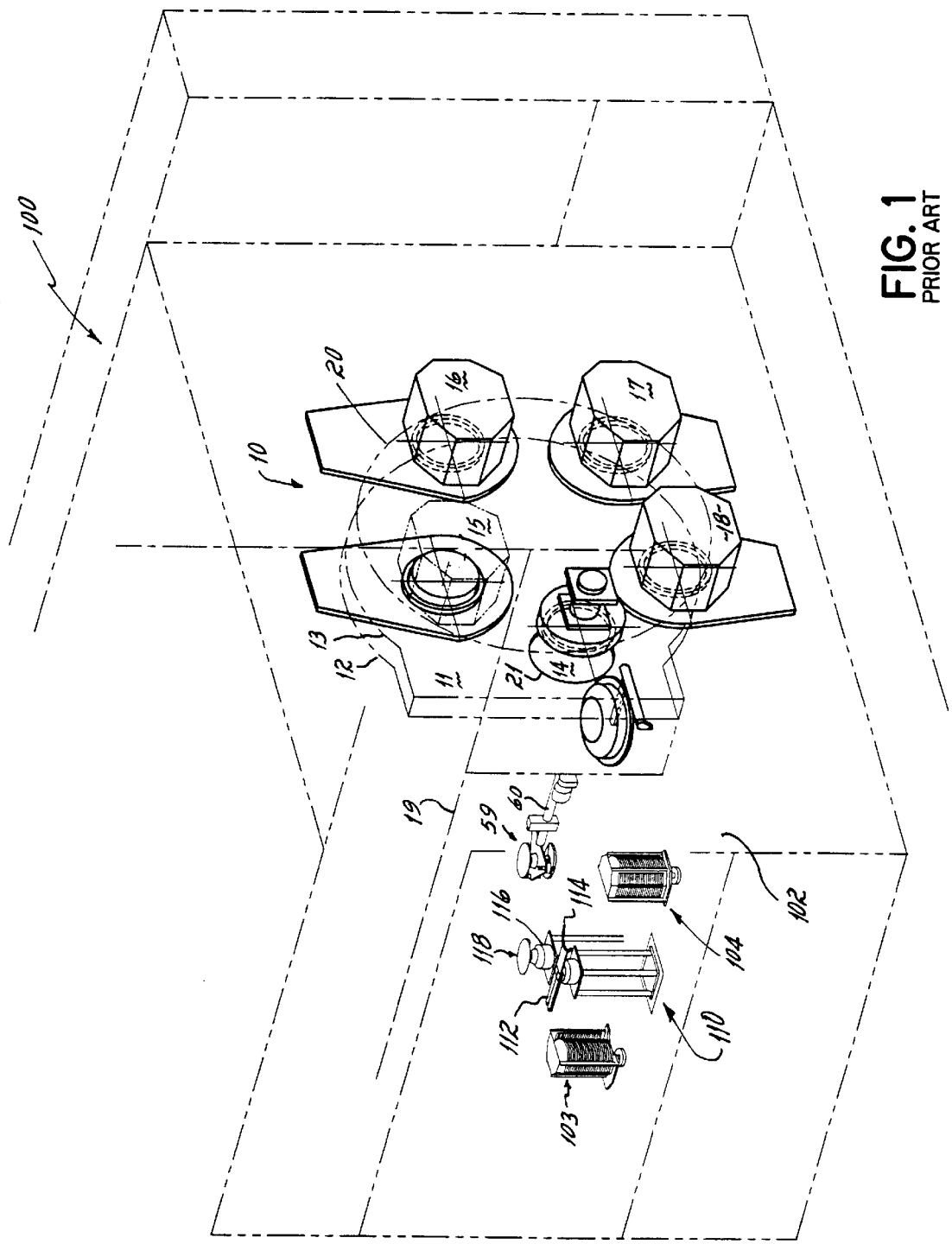
FIG. 1 is a perspective diagram illustrating a wafer handling and processing apparatus of the prior art to which the present invention is applicable.

The environment of the present invention is a semiconductor wafer handling and processing apparatus 100 as diagrammatically illustrated in FIG. 1, which is representative of the prior art. The apparatus 100 includes a high throughput carrousel-type vertical wafer processing machine 10 of the types illustrated and described in U.S. Pat. Nos. 4,915,564 or 5,516,732, both expressly incorporated by reference herein. The invention is also applicable to other types of wafer processing machines, such as typical cluster tool type machines, for example, and other machines in which wafers remain horizontally and upwardly disposed throughout as well as machines in which the wafers are moved through or processed in other orientations. However, the described embodiment is particularly suited for machines of the type of apparatus 100 as described herein, particularly by retrofitting thereto.

Figure 1A:
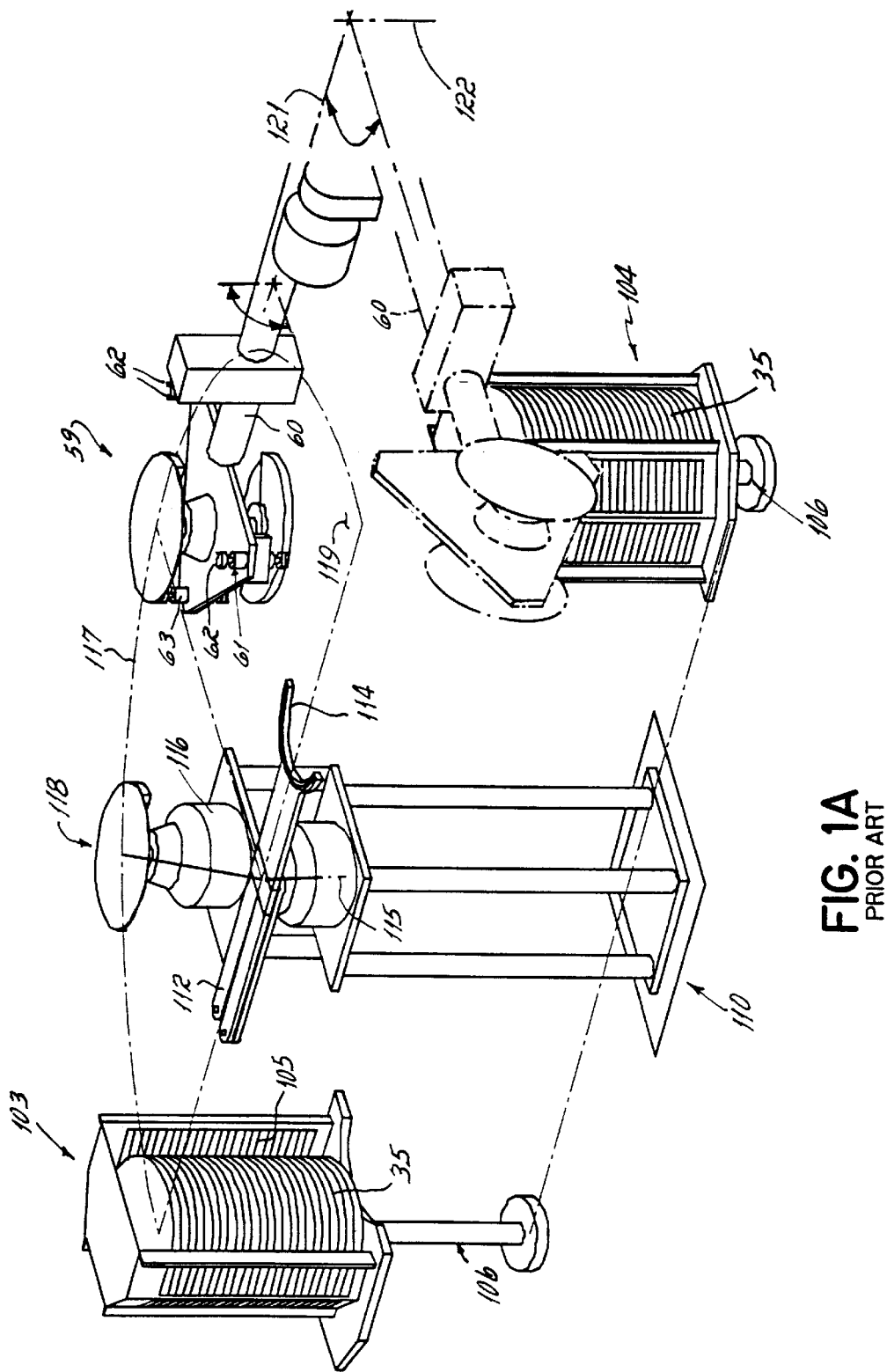
FIG. 1A is an enlarged perspective diagram of a portion of FIG. 1 illustrating movements of chuck assemblies.

The apparatus 100 includes an enclosure 102, illustrated in phantom, having a clean atmosphere contained therein in which is situated the processing machine 10. The enclosure 102 has contained therein provision for supporting two wafer cassettes 103, 104, each of which contains a rack 105 configured to support a vertical stack of horizontally oriented wafers 35 in parallel spaced relationship for processing in the machine 10 (e.g. FIG. 1A). The cassettes 103, 104 are equipped with elevator mechanisms 106 to move the cassettes 103, 104 vertically to bring each of the wafer positions of the rack selectively into a transfer plane so that a wafer 35 therein can be unloaded or loaded into the selected position of the cassette.

The enclosure 102 also has a wafer transfer mechanism 110 therein having a wafer transfer arm 112 that is rotatable about a vertical pivot axis 115 and is extendable in the transfer plane 119. At the free end of the transfer arm 112 is a gripper or end effector 114 adapted to pick up and deposit wafers 35 from and into the cassettes 103, 104 and from and onto a centering chuck 116 of a wafer centering or aligning station 118 and a load arm chuck 59 at the end of a loading arm 60. The cassettes 103, 104, the centering chuck 116 and the load arm chuck 59 are positioned or positionable along a circular arc 117 about the pivot axis 115 of the transfer arm 112. The load arm chuck 59 rotates on the longitudinal axis 121 of the load arm 60 to rotate a wafer 35 held thereby between a horizontal orientation needed to transfer wafers between it and the transfer arm 112 and a vertical orientation needed to transfer wafers to and from a wafer holder 30 (FIG. 2) in the loadlock station 14 of the wafer processing machine 10. The arm 60 further pivots about a vertical axis 122 to transfer wafers to and from the wafer holder 30 in the loadlock station 14.

The machine 10 includes main vacuum chamber 11, which is in the form of a disc-shaped plenum enclosed between two generally circular walls 12, 13 with a plurality of, for example, five, stations 14–18 spaced at even angular intervals around a central horizontal axis 19. Within the chamber 11, mounted for rotary movement on the axis 19, is a circular index plate 20 having five circular openings 21 therein equally spaced to simultaneously align with each of the processing stations 14–18.

Figure 2:
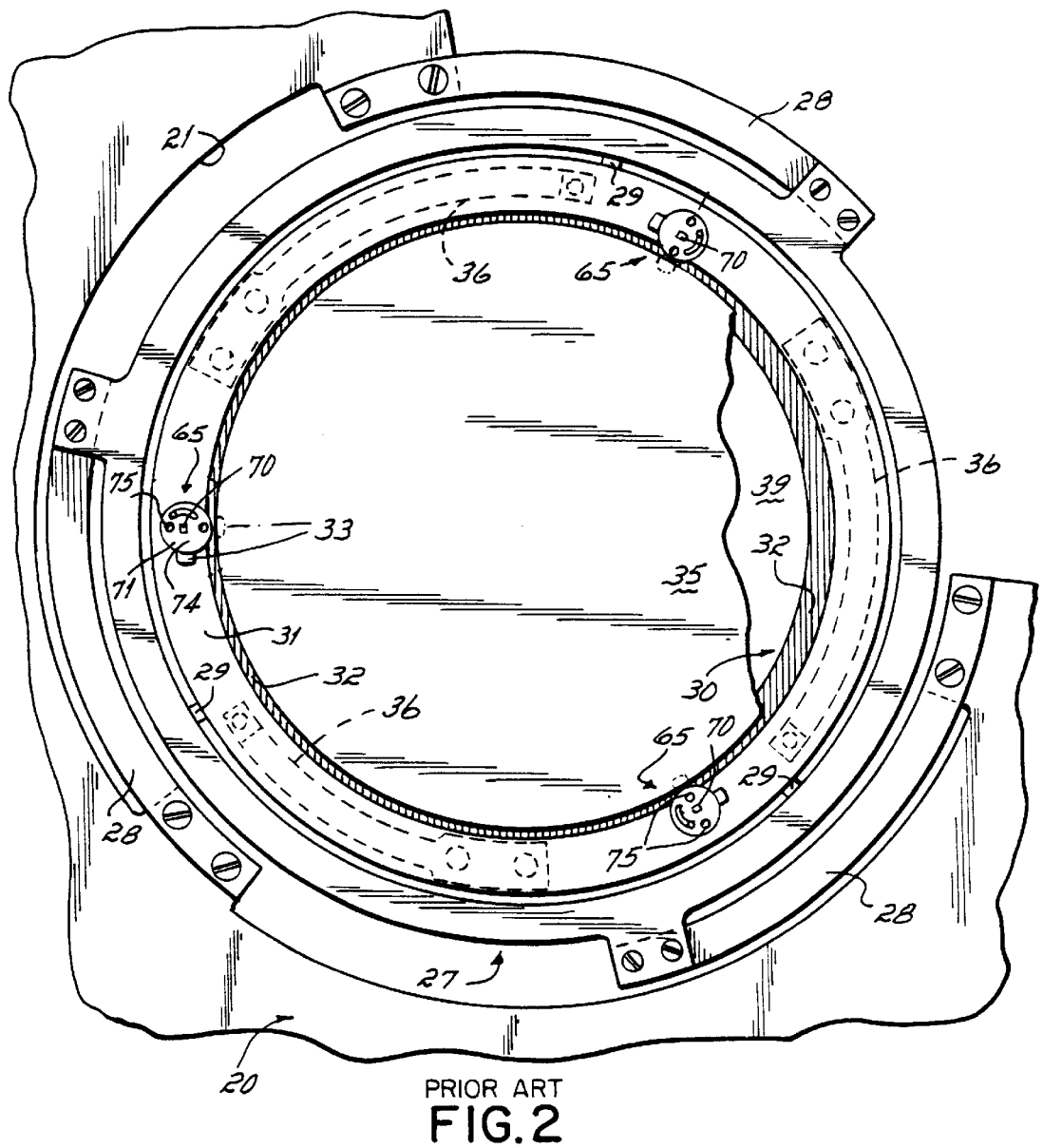
FIG. 2 is a partially broken away view illustrating a prior art wafer holder of the carrousel processing machine of the apparatus of FIG. 1.

As illustrated in FIG. 2, in each of the openings 21, a seal ring 27 is provided, resiliently supported on three equally angularly spaced leaf springs 28 connected to the index plate 20. Within each of the seal rings 27 a wafer holder 30 is provided, rigidly supported on a set of three ceramic insulator pins 29 to the seal ring 27. The wafer holders 30 are each equipped to carry a wafer 35 through each of the processing stations 14–18 as the plate 20 is angularly indexed by one-fifth revolution, or 72°. At least one of the five stations 14–18, for example, station 14, is a loadlock station through which wafers 35 are inserted into and removed from the main chamber 11. The remaining stations 15–18 include any of a number of types of treatment stations, such as sputter coating or etching stations.

The main structure of each of the wafer holders 30 is a ring-shaped annular body 31, typically made of aluminum. The body 31 has a clamp ring 32 resiliently attached to the holder body 31 and biased against the body by a set of three equally angularly spaced leaf springs 36. The clamp ring 32 has an inner diameter slightly less than a wafer 35 that is to be clamped. A wafer 35 is held in an opening 39 of the holder body 31 by the clamp ring 32, which overlies the rim of the wafer 35. The springs 36 press the clamp ring 32 and wafer 35 against a set of three latch clips 33, one of each of three latch assemblies 65 that are spaced at equal angular intervals around the opening 21.

The latch assemblies 65 may be of any of a number of configurations. Those illustrated in FIG. 2 are pivotally mounted to the space around the holder body 31, and are of the type described in detail in U.S. Pat. No. 5,820,329. As shown in FIG. 2, latch clips 33 are fixed at one end to one end of a pivot shaft 70 which is rotatably supported in a bearing (not shown) that extends through the body 31 of the holder 30. At the opposite end of the shaft 70 from the clip 33, the shaft is rigidly connected to a circular disc 74, which has a pair of holes 75 therein with flared openings at the rearward facing surface of the disc 74. The holes 75 are spaced on opposite sides of the shaft 70, at the same distance therefrom, to receive the pins 62 of an actuator 61 (FIG. 3) on a load arm 60 so that rotation of the actuator rotates the disc 74, the shaft 70 and the clip 33 about the axis of the shaft 70. The rotation of the disc 74 on the shaft 70 is limited to 90° of rotational movement. In the loading of the holder 30 having the latch assemblies 65, the wafer 35 is pressed against the clamp ring 32 to move it away from the holder body 31 so that the latch clips 33 can be rotated between latched (phantom lines) and unlatched (solid lines) positions without the clips 33 abrading the surface of the wafer 33.

Figure 2A:
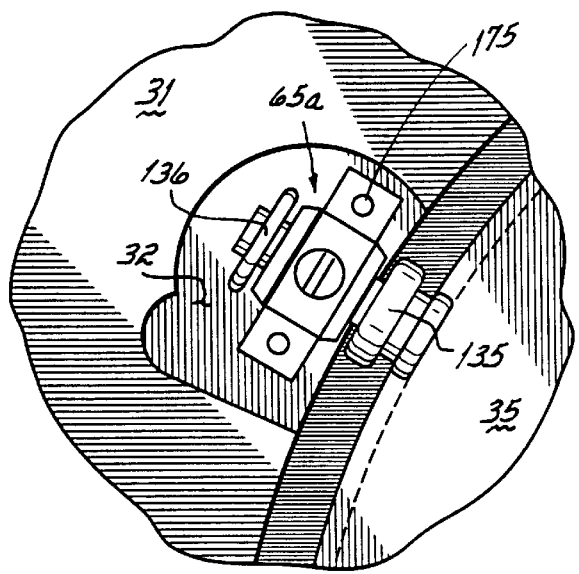
FIG. 2A is a detailed illustration of a prior art alternative embodiment to the latch of FIG. 2 shown in its latched position.

An alternative latch assembly 65a is illustrated in FIGS. 2 and 2A, which are described in U.S. patent application Ser. No. 09/183,503, expressly incorporated by reference herein. The latch assemblies 65a, as with latch assemblies 65 described above, clamp the edge of the wafer 35 against the clamp ring 32 around the opening 39 in the wafer holding clamp ring 32. Each latch assembly 65a is, however, pivotally mounted to the clamp ring 32, rather than to the holder body 31. The latch assembly 65a is so mounted at a mounting post 130 fixed to the clamp ring 32. The latch assembly 65a includes a non-metallic latch body 131 pivotally mounted on the post 130 through a tungsten carbide ball bearing (not shown), and is biased against the clamp ring 32 by a conical spring (not shown) that surrounds the mounting post 130. The latch bodies 131 each have a pair of actuator pin receiving holes or slots 175 therein that are similar to the holes 75 described in connection with the latch assemblies 65 above, which are equally spaced from the mounting post 130, to receive actuator pins of an actuator mechanism on a transfer arm, as described below, which operate the latch assemblies 65a. At opposite ends of the latch body 131 are rotatably mounted a pair of non-metallic rollers, including a front roller 135 and a back roller 136.

Figure 3A:
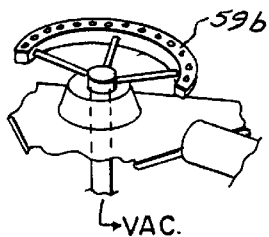
FIG. 3A is a perspective view of one embodiment of the vacuum chuck of the transfer arm of FIG. 3 used in the prior art for backside processing.
Figure 3:
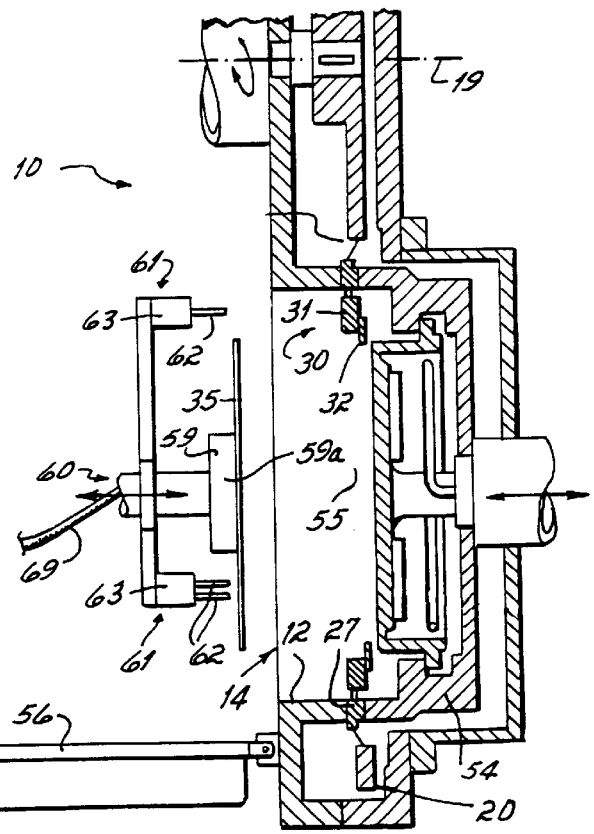
FIG. 3 is a cross-sectional view through a portion of the carrousel processing machine of the prior art apparatus of FIG. 1 in relation to the wafer transfer arm of the apparatus of the prior art.

FIG. 3 is a cross-sectional view through the processing machine 10, through the loadlock station 14.

The loadlock station 14 includes a moveable cup-shaped closure 54, which is actuated to force the seal ring 27 against the front wall 12 of the chamber 11 to form a sealed loadlock chamber 55 at the loadlock station 14. A door 56 provides access for a wafer 35, carried by the vacuum chuck 59 of the transfer or load arm 60.

In the manufacture of semiconductor devices, the load arm 60 operates to translate the wafer 35, device side first, into the loadlock chamber 55, through the opening in the holder body 31, to bring the outer rim of the wafer 35 into contact with the underside of the clamping clamp ring 32. For device side processing, the load arm chuck is a circular chuck 59a that engages the center of the backside of the wafer 35. The vacuum chuck 59a is connected to a selectively operable vacuum source through a vacuum line 69 in the load arm 60.

When processing the backside of a wafer 35, such as where backside metallization is being carried out to deposit a continuous film of a metal such as gold on the wafer, the wafer is inverted and chucks 59, 114, 116 engage the wafer 35 from the device side. Since contact between the chucks and the devices on the wafer must be avoided to prevent damage or destruction of the devices, it is necessary to restrict devices to a reserved or restricted area of the wafer 35 and to avoiding the placement of devices in an exclusion zone on the surface of the wafer. The exclusion zone has historically been an area within 6 mm of the wafer rim around the perimeter of the wafer. In this area of exclusion, arc-shaped vacuum chucks 59b, as illustrated in FIG. 3A, contact only the exclusion area at the edge the wafer 35. The paddle or wafer engaging end of the chucks preferably extends around a major part of the circumference of a 6 mm ring around the perimeter of the wafer.

Insertion of the wafer 35 into the holder 30 is carried out with the latch clips 33 rotated out of the path of the wafer 35. Rotation of the latch clips 33 into and out of position behind the wafer 35 is accomplished by three latch actuators 61 carried by the transfer or load arm 60, also as illustrated in FIG. 3. The latch actuators 61 each include a pair of actuator pins 62 on the shaft of a pneumatically actuatable rotary cylinder 63, which, when the pins 62 are in engagement with a corresponding one of three latching mechanisms 65 on the holder 30, rotate 90° in one direction to simultaneously move the three clips 33 into a latching position behind the wafer 35, and 90° in the opposite direction to move the clips 33 to a release position in the holder beyond the rim of the wafer 35.

Figure 4:
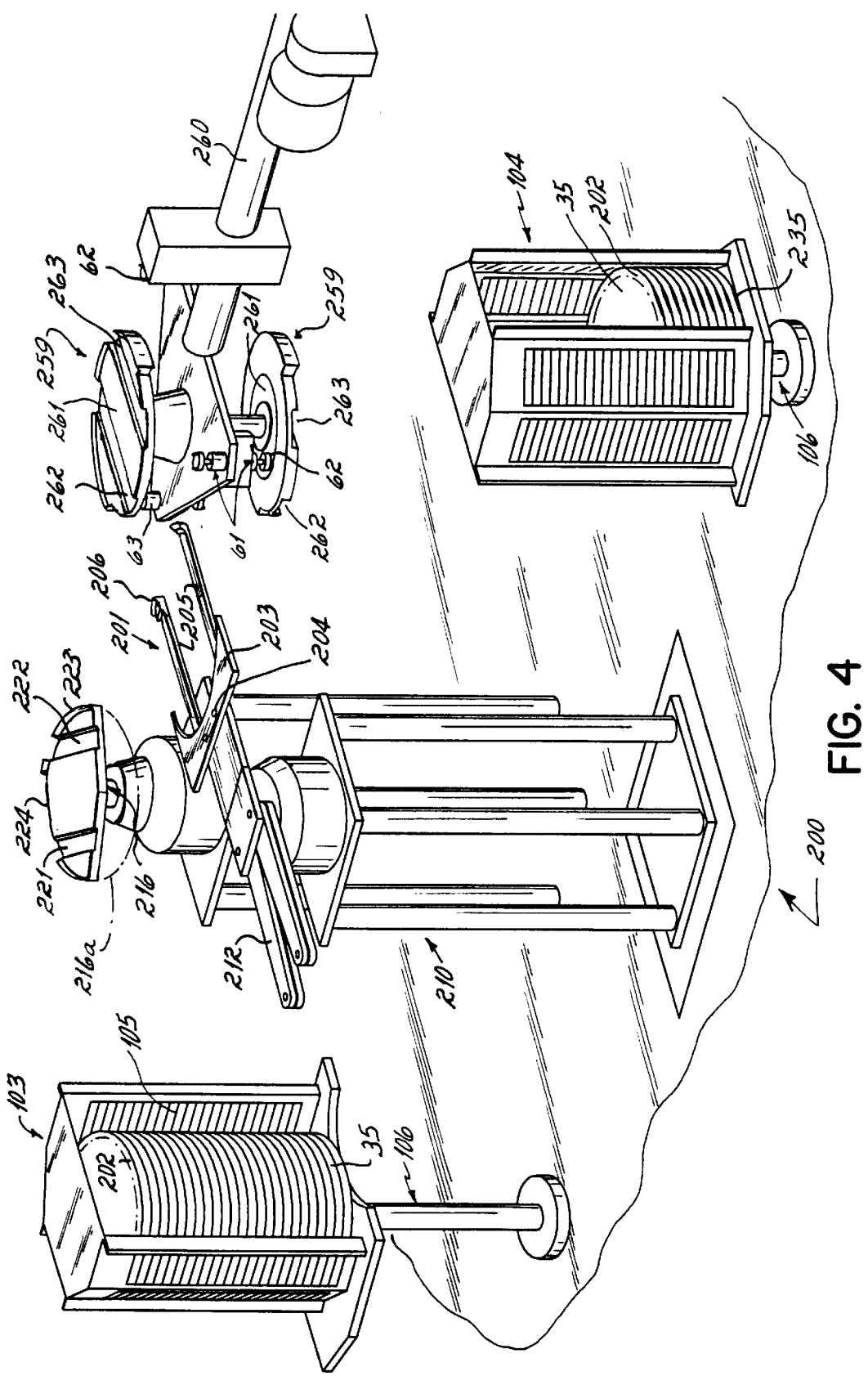
FIG. 4 is a perspective view of a wafer handling system according to one embodiment of the present invention, which is compatible with the prior art apparatus illustrated in FIGS. 1–3A.

According to principles of the present invention, a wafer handling and processing apparatus, such as the apparatus 100, is provided with a wafer transfer mechanism 210, similar to the transfer mechanism 110 of the apparatus 100, described in connection with FIG. 1, but equipped with the wafer handling system 200, one embodiment of which is illustrated in FIG. 4. The system 200 includes three chucks and related hardware, including a transfer arm chuck or end effector 201 located at the end of the transfer arm 212, which operates in the manner of the transfer arm 112 described above. The system 200 also includes a centering chuck 216 at the wafer aligning station 118, which operates in the manner of the centering chuck 116 described above, and a pair of load arm chucks 259 at the end of a load arm 260, which operates in the manner of the load arm 60 described above.

The end effector 201 includes wafer support surfaces that contact a downwardly facing device side of a horizontally disposed wafer 35 only in an exclusion zone 202 within two mm of the edge of the device side of the wafer 35. The wafer 35 rests under the force of gravity on the end effector 201, which moves to move the wafers 35 to and from wafer cassettes 103, 104, to and from the centering chuck 216 at the aligning station 118 and to and from the load arm chuck 259 on the load arm 260. FIGS. 5, 5A–5D illustrate the end effector 201 in detail as including a body in the form of a transfer arm plate 203, which is fixed by screws 204 to the end of the transfer arm 212, and a pair of outrigger arms 205, of trapezoidal cross-section, rigidly attached to the transfer arm plate 203, by fitting into dove-tail keyways (not shown) in the plate 203, where they are held by locking washer nuts 211. The outriggers 205 are adjustable in the keyways to accommodate wafers of different sizes. The arms 205 are ceramic and have upstanding support tips 206 that contact the exclusion area 202 of a wafer 35 being transferred by the transfer arm 212. The plate 203 and the tips 206 have segments 207, 208, respectively, of a circular shoulder thereon configured to support the wafer 35 at its exclusion edge 202. Immediately adjacent the shoulder segments 207, 208 are respective angularly or circumferentially spaced segments 217, 218 of a beveled circular lip which immediately surrounds the peripheral edge of a wafer 35 being carried by the transfer arm 212. The nuts 211 are located tangent to the lip segment 217 and have conical head surfaces 219 that form an extension of the beveled lip, and function with the lip to guide wafers onto the shoulder segments 207, 208.

The segments 217, 218 of the beveled circular lip and the pin head surfaces 219 serve to cause a wafer being supported thereon to immediately center on the end effector 201 without coming to rest with the edge of the wafer beyond the lip. The inside diameter of the bevel surrounds an annular surface of the shoulder segments 207, 208 of less than two mm in width, on which the exclusion zone 202 of the wafer 35 rests. This inside diameter of the bevel equals the nominal diameter of a standard wafer, typically 200 mm or 300 mm, plus the maximum tolerance in the radial direction of about 0.008 inches, or about 0.2 mm, so that the largest wafer will rest inside of the beveled circular lip. The outriggers 205 are secured to the plate 202 in part by washer nuts 211. The conical side surfaces of the heads 219 of the nuts 211 extend the bevel of segments 217, 218 above the upper surfaces of the plate 203 to assist in guiding a wafer 35 onto the circular area surrounded by the segments 217, 218 of the beveled lip when the wafers 35 are picked up from the cassettes 103, 104. The bevels on the chuck rise above the support surface of the chuck a distance of at least the nominal thickness of a wafer and preferably about one mm. The angle of the bevel is preferably about 45°, plus or minus 10° or 15°. The bevel does not have to be all the way around the support surface but can be at a plurality of points, preferably three or more points spanning more than 180°, and preferably four points. The outriggers 205 are sufficiently thin to reach between wafers 35 stacked in the cassettes 103,104 for removal and replacement of the wafers.

Figure 5E:
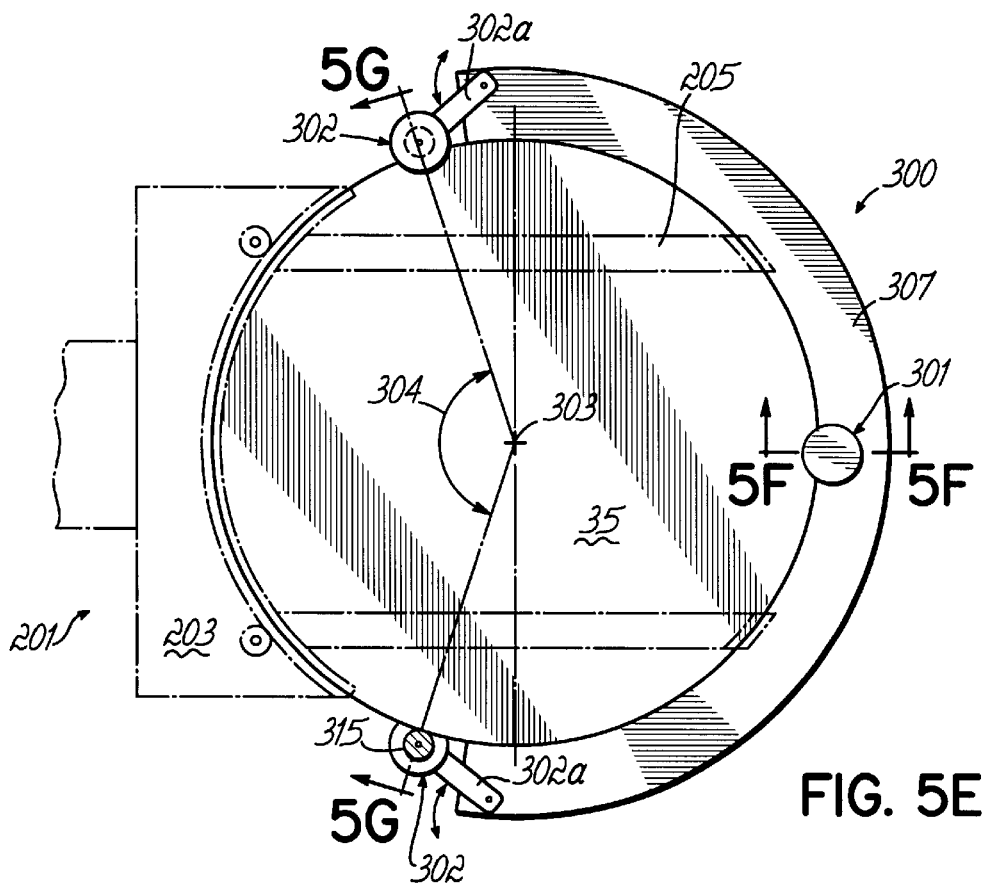
FIG. 5E is a schematic top view, similar to FIG. 5, illustrating the end effector of the wafer transfer arm locating a wafer on an alternative embodiment of the load arm chuck.
Figure 5F:
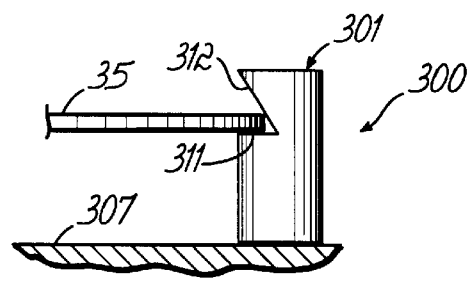
FIG. 5F is a diagrammatic sectional view along line 5F—5F of FIG. 5E.
Figure 5G:
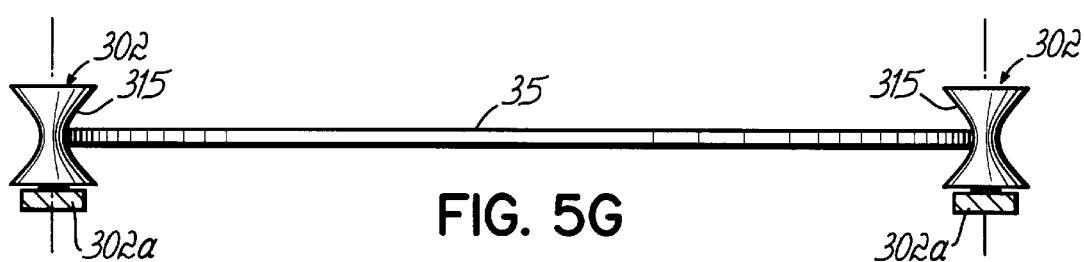
FIG. 5G is a diagrammatic sectional view along line 5G—5G of FIG. 5E.

As illustrated in FIG. 5, the outriggers 205 also are dimensioned to fit into grooves 221,222 in the surface of the centering chuck 216 at the centering station 118. The centering chuck 216 has a lower disk shaped body 216a and a segmented upstanding edge ring 223, which is semicircular to receive a wafer 35 from the end effector 201, that can lift and rotate the wafer on the end effector 201 to bring a flat or notch 235 (FIG. 5) on the wafer 35 to a predetermined orientation corresponding to a flat 224 on the centering chuck 216. The edge ring 223 may be beveled, as with the transfer arm chuck, to guide the wafer into contact with the supporting surfaces of the chuck only in the exclusion area of the wafer, but the absence of beveling may be more compatible with the centering mechanism and function. In the embodiment shown, the edge ring 223 at the centering station has an inner surface perpendicular to the plane of the wafer surface. At the centering station optical sensors on the centering chuck 216 (not shown) determine the wafer orientation.

Also as illustrated in FIG. 5, the load arm chucks 259 each have a chuck plate or body 261 having grooves 262,263 therein to receive the outriggers 205 of the end effector 201. The chucks 259 take the place of the device side engaging vacuum chuck 59b of FIG. 3A. The plate 261 has an upstanding segmented partially circular lip 265 around its edge on which rests an exclusion zone around the edge of the wafer 35. The lip 265 is beveled, as with the transfer arm chuck and centering station chuck described above, to insure that the device side contact is made only with the exclusion zone that is not more than two mm wide.

Figure 8:
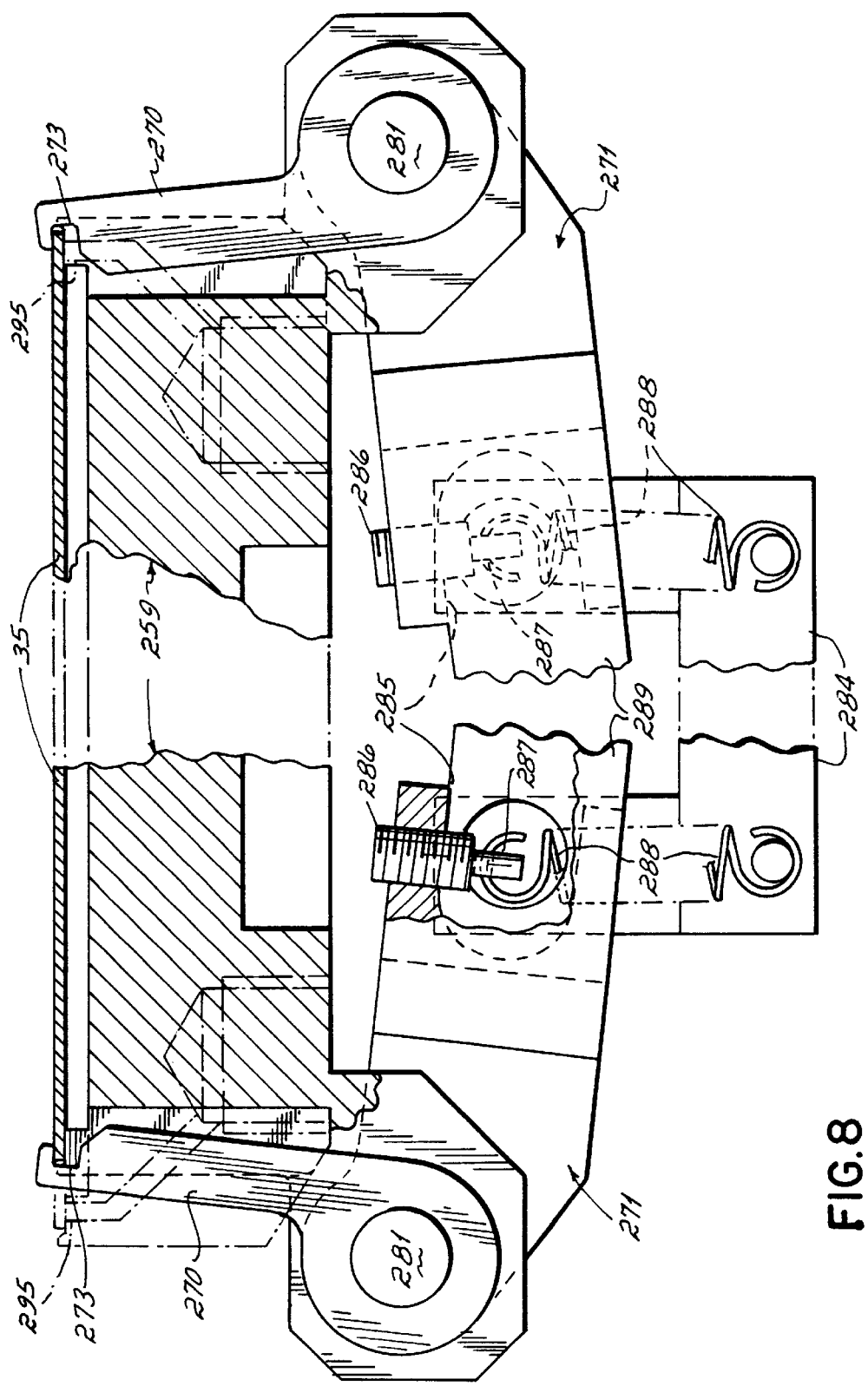
FIG. 8 is an enlarged partial cross-sectional illustrating in more detail the load arm chuck grippers of FIG. 7A.

As illustrated in FIGS. 6, 7, 7A, and 8, at spaced intervals around the lip 265 is a plurality of grippers or gripper fingers 270, for example two to four in number, each pivotally mounted on a rod 281 that is supported in bearings to the body 261 of the load arm chuck 259. The grippers 270 each have a notch 273 therein to capture the peripheral edge of the wafer 35. The grippers 270 each have an operating lever 271 that is controlled by an actuator 272 mounted on the load arm chuck 259, which operates in response to the vacuum commands provided through the line 69 to control the vacuum to operate the vacuum chucks 59, 59a of the prior art system, but which chucks have been removed and replaced with the mechanical load arm chucks 259. The actuator 272 may be an electrically or pneumatically controlled pneumatic cylinder, an electrical-mechanical solenoid or some other device for moving the grippers 270 between the released and gripping positions of FIGS. 7 and 7A. Further, as best seen in FIG. 8, vacuum ports 295 are also provided in the chuck body 261 to connect to a series of holes (not shown) in the lip 265 to provide for the sensing of a properly seated wafer 35 in the chuck 259.

The actuator 272 has a body 282 fixed to the body 261 of the load arm chuck 259 and a moveable element 283 that reciprocates in a direction perpendicular to the body 261 between a retracted position (FIG. 7) proximate the body 261 in which the grippers 270 are in their released position and an extended position (FIG. 7A) away from the body 261 in which the grippers 270 are in their gripping position. Fixed to the end of the moveable element 283 of the actuator 272 is an actuator bar 284, which extends parallel to the body 261 and moves with the element 283. The operating lever 271 of each gripper 270 has a fork 285 thereon having an adjustable set screw 286 threaded therein. The set screw has an eye 287 therethrough in which is hooked a soft spring 288, which is connected in tension between the set screw 286 and a remote end of the actuator bar 284. The spring 288 functions to limit the amount of force that can be exerted by the gripper 270 against the backside of the wafer 35 in clamping the wafer 35 against the lip 265 of the chuck 259. The set screw 286 is provided so that this limit can be manually adjusted. Each operating lever 271 also has a link 289 extending therefrom, which are pivotally joined together at their remote ends with a fork 290 in the end of one pivoting and sliding on a bearing 291 in the end of the other. The interconnection of the ends of the links 289 synchronizes the motion of the grippers 270.

In lieu of the grippers 270, other elements can be used to latch the wafer to the load arm. Rotatable latches having rollers or fingers, for example, such as those described in connection with the prior art described and incorporated by reference above, can be used. These can also be operated by pneumatically operated actuators 61 or by mechanical or other devices.

For example, FIG. 5E illustrates an alternative embodiment 300 to the load arm chuck 259, that employs support of the wafer 35 on three edge supports that include a fixed pin 301 and two rollers 302. The load arm chuck 300 of this embodiment is illustrated in a form configured for the support of 300 mm wafers without an edge flat 235 of the embodiment shown in FIG. 5. Alternatively, a wafer 35 with a flat or notch may be placed on the chuck 300 with the flat or notch oriented to miss the fixed pin 301 and rollers 302. The chuck 300 may be employed as a load arm chuck or a centering station chuck. The chuck 300 provides contact with three or more points on the edge of the wafer 35, and includes, for example, a housing 307 to which is mounted a fixed pin 301 and a pair of concave or notched rollers 302. The rollers 302 are mounted to the housing 307 so as to latch against and retract from the edge of the wafer 35. The chuck 300 is configured such that the transfer arm chuck or end effector 201 can deliver the wafer 35 to the chuck 300 by advancing the wafer edgewise between the two rollers 302, when they are in retracted positions, and against the fixed pin 301. The rollers 302 are located opposite the centerline 303 of the chuck 300 from the fixed pin 301, with the rollers being spaced at an angle 304 of preferably at least 160° apart, but less than 180° apart. An angle of less than 160° is acceptable depending on the design of the end effector 201.

When the chuck 300 is upwardly facing, the fixed pin 301 has a horizontal surface 311 to support the edge of the wafer 35 by contacting the wafer 35 only within the 2 mm exclusion zone as shown, for example, in FIG. 5F. The pin 301 has an overhanging inclined and nearly vertical surface 312 which faces radially inwardly toward the center of the wafer 35. The rollers 302 may be mounted on pivotal levers 302a so as to swing, in response to the motion of the actuators 61, between retracted positions away from the edge of the wafer 35 to latching positions against the edge of the wafer 35, as illustrated in FIG. 5E. Alternatively, the rollers 302 can be pivoted in response to other actuators that respond to the signal that was formerly used to control the vacuum chuck, as in the case of the actuators 272 for the gripper fingers 270 in the embodiments discussed above. The rollers 302 have smooth concave surfaces 315 to trap the edge of the wafer 35 when in the latching positions, at which the wafer 35 is picked up from the end effector 201. The concave surfaces 315 of the rollers 302 and the combined inclined surface 312 and horizontal surface 311 of the fixed pin 301 trap the wafer 35 on the chuck 300 so that the wafer 35 can be rotated to a vertical orientation or downwardly facing orientation, and transferred to and from a wafer holder 30.

The load arm chuck provides for the correct placement of the wafer into the wafer processing machine. After being so positioned into a vacant wafer holder 30 within the loadlock of the processing machine, the grippers or latches release the wafer while the wafer holder simultaneously is grasping the wafer. The opposite sequence is used to remove a wafer from the loadlock. When the load arm chuck withdraws from the wafer holder, the processing machine can index the next wafer holder into the loadlock. With two chucks on the load arm, the load arm checks for the presence of a wafer in the wafer holder at the loadlock and, if one is present, removes the wafer with an empty chuck on the load arm. Then, the load arm rotates 180° to bring a new wafer into position and loads it into the wafer holder in the loadlock. The chuck that deposits the wafer into the loadlock is then available to receive the next wafer from the transfer arm end effector before rotating 180° to transfer the processed wafer on the other chuck of the load arm onto the end effector.

While the above description and accompanying drawings set forth various embodiments of the invention, it will be apparent to those skilled in the art that additions and modifications may be made without departing from the principles of the invention.

What is claimed is:

1. An improvement kit for a semiconductor wafer handling system of a semiconductor wafer processing machine having (a) a cassette station for supporting a wafer cassette containing vertical stack of a plurality of horizontally disposed wafers, (b) an aligning station for centering a horizontally disposed wafer, (c) a transfer station, (d) a transfer arm for transferring individual wafers among the cassette station, the aligning station and a load arm at the transfer station, (e) a processing apparatus having a plurality of processing stations, including a load-lock station, disposed in a circle in a vertical plane, (f) a load arm for transferring wafers between a horizontal orientation on the transfer arm at the transfer station and a vertical orientation in the processing apparatus at the load lock station, to facilitate transporting semiconductor wafers having devices structure on a device side thereof for backside deposition in a processing station while limiting contact with the device side of the wafer to an exclusion area not more than two millimeters wide adjacent the edge of the wafer, the kit comprising:
    a transfer arm chuck mountable on the transfer arm;
    an aligning station chuck mountable at the aligning station;
    a load arm chuck mountable on the load arm; and
    each of the transfer arm, aligning station and load arm chucks having:
        a wafer support surface lying in a plane and formed of segments of an annular ring not more than 2 millimeters wide having a nominal diameter selected from the group consisting of 200 millimeters or 300 millimeters, an outside diameter at least as large as said nominal diameter and an inside diameter less than said nominal diameter; and
    each of the transfer arm and load arm chucks having:
        a bevel extending outwardly from the support surface in at least a plurality of angularly spaced sections adjacent the outside diameter of the annular ring on each of the segments thereof, the bevel being positioned to guide the edge of a wafer onto the support surface and to substantially restrict contact between the support surface of the chuck and the wafer to the exclusion area.

2. The kit of claim 1 wherein:
the wafer support surface has an outside diameter at least 0.2 mm larger than said nominal diameter and an inside diameter at least 0.2 mm less than said nominal diameter.

3. The kit of claim 1 wherein:
the wafer support surface of the transfer arm chuck lies in a horizontal plane and is upwardly facing; and
the transfer arm chuck includes:
    a body mounted on the end of the transfer arm; the body having at least one of the segments of the annular ring thereon;
    at least two outrigger arms extending from the body, each outrigger arms having at least one of the segments of the annular ring at a remote end thereof; and
    the bevel of the transfer arm chuck extending upwardly from the outside diameter of the support surface on at least one of the sections of each of the body and outrigger arms.

4. The kit of claim 1 wherein:
the wafer support surface of the transfer arm chuck lies in a horizontal plane and is upwardly facing; and
the transfer arm chuck includes:
    a body mounted on the end of the transfer arm;
    at least two ceramic outrigger arms removably attached to the body and extending away from the body to a remote end thereof having at least one of the segments of the annular ring thereon; and
    the bevel of the transfer arm chuck extending upwardly from the outside diameter of the support surface on at least one of the sections of each of the body and the at least two ceramic outrigger arms.

5. The kit of claim 4 wherein each ceramic outrigger arm has a straight proximate end of trapezoidal cross-section fitted into a keyway in the body of the transfer arm chuck with parallel upper and lower surfaces, the upper of which is wider than the lower thereof.

6. The kit of claim 1 wherein the system includes: transfer arm chuck includes:
    vacuum ports positioned on the wafer supporting surface of the transfer arm chuck; and
    a wafer presence detector connected to the vacuum ports and responsive to the blocking of the vacuum ports by the exclusion zone of a wafer.

7. The kit of claim 1 wherein:
the aligning station chuck has a wafer support surface lying in a plane and formed of segments of an annular ring not more than 2 millimeters wide having a nominal diameter selected from the group consisting of 200 millimeters or 300 millimeters, an outside diameter at least as large as said nominal diameter and an inside diameter less than said nominal diameter.

8. The kit of claim 7 wherein:
the wafer support surface of the aligning station chuck lies in a horizontal plane and is upwardly facing; and
the aligning station chuck has at least one recess thereon located between two sections of the supporting surface thereof to allow the outrigger arms of the transfer arm chuck to extend between a wafer lying on said supporting surface and said supporting surface of the aligning station chuck when placing a wafer on or pick a wafer up from the aligning station chuck.

9. The kit of claim 1 wherein:
the wafer support surface of the aligning station chuck lies in a horizontal plane and is upwardly facing; and
the aligning station chuck has at least one recess thereon located between two sections of the supporting surface thereof to allow the outrigger arms of the transfer arm chuck to extend between a wafer lying on said supporting surface and said supporting surface of the aligning station chuck when placing a wafer on or pick a wafer up from the aligning station chuck.

10. The kit of claim 1 wherein:
the load arm chuck is mounted on the load arm of the machine and has:
    at least one recess thereon located between two sections of the supporting surface thereof to allow the outrigger arms of the transfer arm chuck to extend between a wafer lying on said supporting surface and said supporting surface of the load arm chuck when placing a wafer on or pick a wafer up from the load arm chuck, and a set of moveable locking elements operable, when engaged, to move against the backside of the wafer opposite the exclusion area thereof to clamp the wafer against the support surface of the load arm chuck and, when disengaged, to release the wafer.

11. The kit of claim 1 wherein the load arm chuck has at least one recess thereon located between two sections of the supporting surface thereof to allow the outrigger arms of the transfer arm chuck to extend between a wafer lying on said supporting surface and said supporting surface of the load arm chuck when placing a wafer on or pick a wafer up from the load arm chuck.

12. The kit of claim 1 wherein the load arm chuck has a set of moveable locking elements operable, when engaged, to move against the backside of the wafer opposite the exclusion area thereof to clamp the wafer against the support surface of the load arm chuck and, when disengaged, to release the wafer.

* * * * *

UNITED STATES PATENT AND TRADEMARK OFFICE
CERTIFICATE OF CORRECTION

PATENT NO.      : 6,692,219 B2
DATED           : November 29, 2000
INVENTOR(S)     : Stephen D. Coomer et al.

It is certified that error appears in the above-identified patent and that said Letters Patent is hereby corrected as shown below:

Column 1,
Lines 31, 32 and 33, reads "metallization" and should read -- metalization --.

Column 3,
Line 30, reads "may be other types of wafer holding devices such rotary latches, similar to" and should read -- may be other types of wafer holding devices such as rotary latches, similar to --.

Column 6,
Line 25, reads "may be of any of a number of" and should read -- may be any of a number of --.

Column 7,
Line 22, reads "metallization" and should read -- met alization --.
Line 29, reads "and to avoiding the placement of devices in" and should read -- and to avoid the placement of devices in --.
Line 34, reads "contact only the exclusion area at the edge the wafer 35." and should read -- contact only the exclusion area at the edge of the wafer 35. --.

Column 8,
Line 42, reads "about 0.008 inches, or about" and should read -- about 0.008 inch, or about --.

Column 12,
Line 2, reads "at least two outrigger arms extending from the body, each outrigger arms having at least one of" and should read -- at least two outrigger arms extending from the body, each outrigger arm having at least --.
Lines 51 and 61, reads "when placing a wafer on or pick a wafer up from" and should read -- when placing a wafer on or picking a wafer up from --.

Column 13,
Line 4, reads "when placing a wafer on or pick a wafer up from" and should read -- when placing a wafer on or picking a wafer up from --.

UNITED STATES PATENT AND TRADEMARK OFFICE
CERTIFICATE OF CORRECTION

PATENT NO. : 6,692,219 B2
DATED : November 29, 2000
INVENTOR(S) : Stephen D. Coomer et al.

It is certified that error appears in the above-identified patent and that said Letters Patent is hereby corrected as shown below:

Column 14,
Line 3, reads "when placing a wafer on or pick a wafer up from" and should read -- when placing a wafer on or picking a wafer up from --.

Signed and Sealed this

Twenty-eighth Day of December, 2004

JON W. DUDAS
*Director of the United States Patent and Trademark Office*